(12) United States Patent
Kim et al.

(10) Patent No.: US 10,580,805 B2
(45) Date of Patent: Mar. 3, 2020

(54) DISPLAY APPARATUS HAVING A STEPPED PART

(71) Applicant: SAMSUNG DISPLAY CO., LTD., Yongin-si, Gyeonggi-Do (KR)

(72) Inventors: Hyo Jin Kim, Seoul (KR); Won Kyu Lee, Seoul (KR); Seung Gyu Tae, Osan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/157,837

(22) Filed: Oct. 11, 2018

(65) Prior Publication Data

US 2019/0051676 A1 Feb. 14, 2019

Related U.S. Application Data

(62) Division of application No. 15/091,624, filed on Apr. 6, 2016, now Pat. No. 10,128,279.

(30) Foreign Application Priority Data

Apr. 30, 2015 (KR) .................. 10-2015-0062088

(51) Int. Cl.
*H01L 27/12* (2006.01)
(52) U.S. Cl.
CPC ...... *H01L 27/1255* (2013.01); *H01L 27/1225* (2013.01); *H01L 27/1244* (2013.01); *H01L 27/1248* (2013.01)

(58) Field of Classification Search
None
See application file for complete search history.

(56) References Cited

U.S. PATENT DOCUMENTS

2005/0134783 A1* 6/2005 Park ................ G02F 1/134363
349/141
2013/0334508 A1* 12/2013 Moon ................ H01L 51/5203
257/40
2016/0322402 A1 11/2016 Kim et al.

\* cited by examiner

*Primary Examiner* — Bilkis Jahan
*Assistant Examiner* — Victor V Barzykin
(74) *Attorney, Agent, or Firm* — F. Chau & Associates, LLC (57) ABSTRACT

Provided is a display apparatus including a substrate and a semiconductor layer including first and second semiconductor layers. A first gate insulating layer is formed on the semiconductor layer. A first gate wiring overlapping the first semiconductor layer is formed on the first gate insulating layer. A second gate insulating layer is formed on the first gate wiring. A second gate wiring overlapping the second semiconductor layer is formed on the second gate insulating layer. A third gate insulating layer covers the second gate wiring. A driving voltage line intersecting the first and second gate wirings is formed on the third gate insulating layer. A data line intersecting the first and second gate wirings is formed on the third gate insulating layer. A short circuit protection area is formed between the first gate wiring, the second gate wiring, the driving voltage line and the data line.

14 Claims, 6 Drawing Sheets

DISPLAY APPARATUS HAVING A STEPPED PART

CROSS-REFERENCE TO RELATED APPLICATION

This application is a divisional application of U.S. patent application Ser. No. 15/091,624, filed on Apr. 6, 2016, which claims priority under 35 U.S.C. § 119 to Korean Patent Application No. 10-2015-0062088 filed in the Korean Intellectual Property Office on Apr. 30, 2015, the disclosure of which is incorporated by reference herein in its entirety.

(A) TECHNICAL FIELD

Exemplary embodiments of the present invention relate to a display apparatus, and more particularly to a display apparatus having a stepped part.

(B) DISCUSSION OF RELATED ART

Various display apparatuses such as an organic light emitting device and a liquid crystal display may control a display operation by a thin film transistor (TFT). A display apparatus including a transistor and a capacitor driving the display apparatus may be formed on a substrate. The display apparatus may be formed by connecting display panels such as an organic light emitting panel and a liquid crystal panel, which include a plurality of pixels displaying an image, to the substrate.

Some high resolution display apparatuses have a structure in which a size of each unit pixel formed in the display apparatus is reduced or one pixel includes a plurality of transistors to more finely display an image.

As a disposition density of pixels included in the display apparatus is increased, a distance between adjacent transistors may be relatively short and therefore an occurrence of a short circuit between wirings formed in these transistors may be increased, such that a defective rate of products may be increased.

SUMMARY

Exemplary embodiments of the present invention may provide a display apparatus capable of protecting a short circuit from occurring between adjacent wirings.

Exemplary embodiments of the present invention are not limited to the exemplary embodiments described herein.

An exemplary embodiment of the present invention provides a display apparatus including a substrate and a semiconductor layer formed on the substrate. The semiconductor layer includes a first semiconductor layer and a second semiconductor layer spaced apart from the first semiconductor layer. A first gate insulating layer is formed on the semiconductor layer. A first gate wiring is formed on the first gate insulating layer. The first gate wiring overlaps the first semiconductor layer. A second gate insulating layer is formed on the first gate wiring. A second gate wiring is formed on the second gate insulating layer. The second gate wiring overlaps the second semiconductor layer. A third gate insulating layer covers the second gate wiring. A driving voltage line is formed on the third gate insulating layer. The driving voltage line intersects the first gate wiring and the second gate wiring. A data line is formed on the third gate insulating layer. The data line intersects the first gate wiring and the second gate wiring. A short circuit protection area is formed between the first gate wiring and the second gate wiring. The short circuit protection area is formed between the driving voltage line and the data line. An interval between the first gate wiring and the second gate wiring in the short circuit protection area is larger than an interval between the first gate wiring and the second gate wiring outside of the short circuit protection area.

The interval between the first gate wiring and the second gate wiring in the short circuit protection area may be an average value of the interval between the first gate wiring and the second gate wiring in the short circuit protection area.

The interval between the first gate wiring and the second gate wiring in the short circuit protection area may be a maximum value of the interval between the first gate wiring and the second gate wiring in the short circuit protection area.

The display apparatus may include a lower electrode of a capacitor formed on the second gate insulating layer; and an upper electrode of the capacitor formed on the third gate insulating layer.

The display apparatus may include a buffer layer formed between the substrate and the semiconductor layer.

Another exemplary embodiment of the present invention provides a display apparatus, including a substrate and a semiconductor layer formed on the substrate. The semiconductor layer includes a first semiconductor layer and a second semiconductor layer spaced apart from the first semiconductor layer. A first gate insulating layer is formed on the semiconductor layer. A first gate wiring is formed on the first gate insulating layer. The first gate wiring overlaps the first semiconductor layer. A second gate insulating layer is formed on the first gate wiring. A second gate wiring formed on the second gate insulating layer. The second gate wiring overlaps the second semiconductor layer, A third gate insulating layer covers the second gate wiring. A driving voltage line is formed on the third gate insulating layer. The driving voltage line intersects the first gate wiring and the second gate wiring. A data line is formed on the third gate insulating layer, The data line intersects the first gate wiring and the second gate wiring. A short circuit protection area is formed between the first gate wiring and the second gate wiring. The short circuit protection area is formed between the driving voltage line and the data line. A stepped part protrudes from any one of the first gate wiring and the second gate wiring formed in the short circuit protection area.

The stepped part may protrude from the first gate wiring toward the second gate wiring to be disposed under the second gate wiring, The stepped part may form a step on the second gate wiring and the third gate insulating layer.

The stepped part may protrude from the second gate wiring toward the first gate wiring to be disposed on the first gate wiring. The stepped part may form a step on the second gate wiring and the third gate insulating layer.

The stepped part may include a same material as at least one of the first gate wiring and the second gate wiring.

The display apparatus may include a lower electrode of a capacitor formed on the second gate insulating layer; and an upper electrode of the capacitor formed on the third gate insulating layer.

The display apparatus may further include a buffer layer formed between the substrate and the semiconductor layer.

According to an exemplary embodiment of the present invention a display apparatus reducing or preventing a short circuit from occurring between adjacent wirings may be provided,

BRIEF DESCRIPTION OF THE DRAWINGS

The above and other features of the present invention will become more apparent by describing in detail exemplary embodiments thereof, with reference to the accompanying drawings in which.

DETAILED DESCRIPTION OF THE EMBODIMENTS

Hereinafter, exemplary embodiments of the present invention will be described in more detail with reference to the accompanying drawings.

The drawings and description are to be regarded as illustrative in nature and not restrictive. Like reference numerals may refer to like elements throughout the specification and drawings. The size and thickness of components in the drawings are not limited to those shown in the drawings.

In the drawings, the thickness of layers, films, panels, or regions may be exaggerated for clarity. It will be understood that when an element such as a layer, film, region, or substrate is referred to as being "on" another element, it may be directly on the other element or intervening elements may be present.

Figure 1:
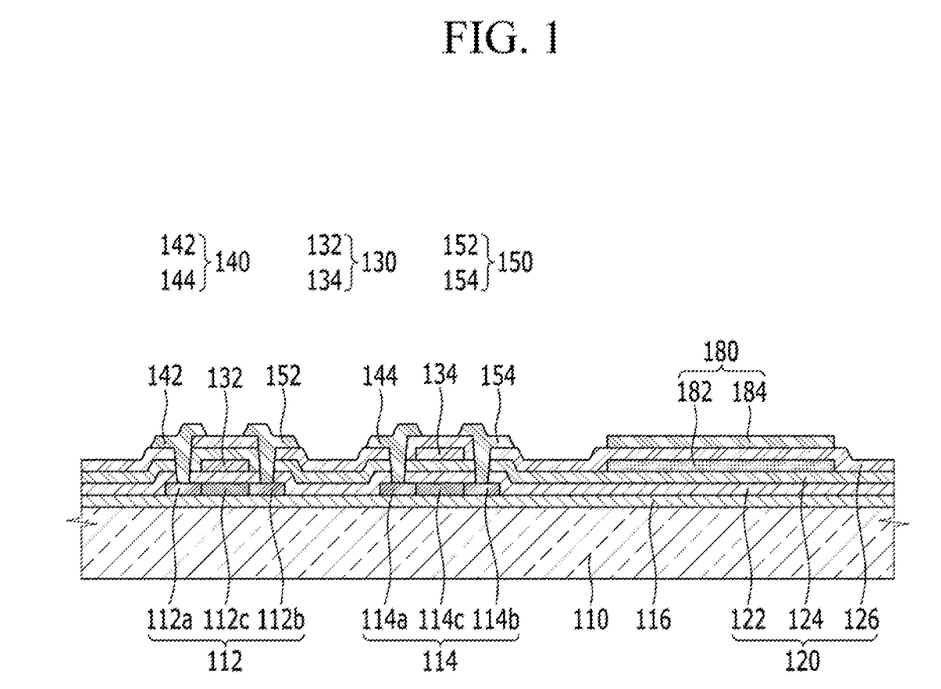
FIG. 1 is a diagram illustrating a cross section of a portion of a display apparatus according to an exemplary embodiment of the present invention.
Figure 2:
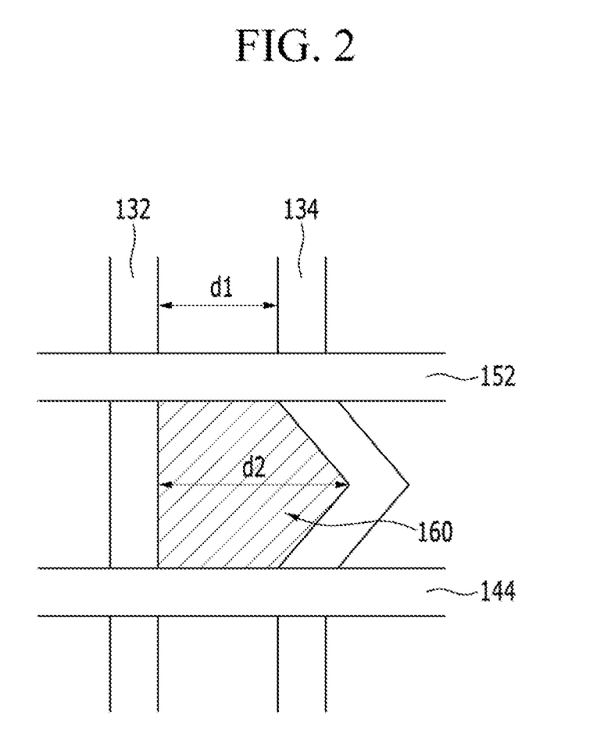
FIG. 2 is a diagram schematically illustrating a short circuit protection area according to an exemplary embodiment of the present invention.

FIG. 1 is a diagram illustrating a cross section of a portion of a display apparatus according to an exemplary embodiment of the present invention. FIG. 2 is a diagram schematically illustrating a short circuit protection area according to an exemplary embodiment of the present invention.

As illustrated in FIG. 1, a display apparatus according to an exemplary embodiment of the present invention may include a substrate 110, semiconductor layers 112 and 114, a gate insulating layer 120, a gate wire, driving voltage lines 140, 142, and 144, and data lines 150, 152, and 154. A portion of the gate insulating layer 120 may include a short circuit protection area 160 (see, e.g., FIG. 2).

The substrate 110 may be stacked with other components according to an exemplary embodiment of the present invention, The substrate may be a portion of a base of the display apparatus according to an exemplary embodiment of the present invention. The substrate 110 according to an exemplary embodiment of the present invention may include at least one relatively hard material such as glass, quartz, or ceramic, or at least one relatively soft material such as plastic. The substrate 110 may include at least one electrical insulating material.

The semiconductor layers 112 and 114 may be formed on the substrate 110. The semiconductor layers 112 and 114 may include a first semiconductor layer 112 and a second semiconductor layer 114.

Each of the semiconductor layers 112 and 114 may include polysilicon or an oxide semiconductor. The oxide semiconductor may include any one of an oxide of titanium (Ti), hafnium (Hf), zirconium (Zr), aluminum (Al), tantalum (Ta), germanium (Ge), zinc (Zn), gallium (Ga), tin (Sn), or indium (In), and a zinc oxide (ZnO), an indium-gallium-zinc oxide ($InGaZnO_4$), an indium-zinc oxide (Zn—In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), and a hafnium-indium-zinc oxide (Hf—In—Zn—O), which may be composite oxides thereof. When the semiconductor layers 112 and 114 include the oxide semiconductor, the semiconductor layers 112 and 114 may include a separate passivation layer, which may protect the oxide semiconductor from external environments, such as high temperature.

Each of the semiconductor layers 112 and 114 may include channel areas 112a and 114a which may be channel-doped with N type impurities or P type impurities and may be doped on both sides of the channel areas 112a and 114a. Each of the semiconductor layers 112 and 114 may include source areas 112b and 114b and drain areas 112c and 114c which may be doped with doping impurities having an opposing type to the doping impurities doped in the channel areas 112a and 114a.

The channel areas 112a and 114a of the semiconductor layers 112 and 114 may overlap with the gate electrode in the thin film transistor for driving each pixel included in the display apparatus. The source areas 112b and 114b and the drain areas 112c and 114c each may be electrically connected to the source area and the drain electrode of the thin film transistor.

The first semiconductor layer 112 and the second semiconductor layer 114 may serve as a semiconductor layer, a switching semiconductor layer, and an emission control semiconductor layer depending on the role of the overlappingly disposed thin film transistor, but exemplary embodiments of the present invention are not limited thereto. As the number of thin film transistors disposed within each pixel included in the display apparatus is increased, the number of semiconductor layers 112 and 14 overlapping with each transistor may be increased and roles performed by each of the semiconductor layers 112 and 114 may be subdivided.

A buffer layer 116 may be formed between the substrate 110 and the semiconductor layers 112 and 114 according to an exemplary embodiment of the present invention. The buffer layer 116 may reduce or prevent impurities from being diffused between the substrate 110 and the semiconductor layers 112 and 114. The buffer layer 116 may be a thin layer formed on the substrate 110 to planarize the surface of the substrate 110.

The gate insulating layer 120 including a plurality of layers may be formed on the semiconductor layers 112 and 114 and a gate wiring 130, the driving voltage lines 140, 142, and 144, and the data lines 150, 152, and 154 may be formed on the gate insulating layer 120 of different layers. Forming the gate wiring 130, the driving voltage lines 140, 142. and 144, and the data lines 150, 152, and 154 will be described below in more detail below with reference to FIG. 1 in which a stacked structure of the display apparatus according to an exemplary embodiment of the present invention is schematically illustrated.

As illustrated in FIG. 1, a first gate insulating layer 122 may be formed on the semiconductor layers 112 and 114 and a second gate insulating layer 124 may be formed on the first gate insulating layer 122. A third gate insulating layer 126 may be formed on the second gate insulating layer 124. The gate insulating layer 120 including the first gate insulating layer 122, the second gate insulating layer 124 and the third gate insulating layer 126 according to an exemplary embodiment of the present invention may include an electrical insulating material including ceramics such as silicon nitride ($SiN_x$) or silicon oxide $SiO_2$, but exemplary embodiments of the present invention are not limited thereto.

According to an exemplary embodiment of the present invention, a first gate wiring 132 overlapping with the channel area 112a of the first semiconductor layer 112 may be formed between the first gate insulating layer 122 and the second gate insulating layer 124 and a second gate wiring 134 overlapping the channel area 114a of the second semiconductor layer 114 may be formed between the second gate insulating layer 124 and the third gate insulating layer 126.

The first gate wiring 132 and the second gate wiring 134 may be formed on different layers but may be disposed along a direction parallel with each other. That is, when viewing the first gate wiring 132 and the second gate wiring 134 from a top plan view, the first gate wiring 132 and the second gate wiring 134 may be parallel with each other.

The first gate wiring 132 according to an exemplary embodiment of the present invention may be formed on the first gate insulating layer 122 and the second gate wiring 134 may be formed on the second gate insulating layer 124 and thus the first gate wiring 132 and the second gate wiring 134 may be formed on different layers. According to an exemplary embodiment of the present invention, when the gate wirings are formed on different layers, a distance between adjacent gate wirings 130 may be formed to be narrow, and thus the display apparatus having higher resolution may be realized.

The driving voltage lines 140, 142, and 144 and the data lines 150, 152, and 154 which may intersect with the first gate wirings 132 and the second gate wirings 134. respectively, may be formed on the third gate insulating layer 126. The driving voltage lines 140, 142, and 144 and the data lines 150, 152, and 154 may each be formed on the same layer or different layers. The driving voltage lines 140, 142, and 144 and the data lines 150, 152, and 154 may each be formed on the third gate insulating layer 126.

The display apparatus according to an exemplary embodiment of the present invention may include a plurality of driving voltage lines 140, 142, and 144 and a plurality of data lines 150, 152, and 154. The driving voltage lines 140, 142, and 144 and the data lines 150, 152, and 154 may be connected to the source electrodes and the drain electrodes of different thin film transistors.

The driving voltage lines 140, 142, and 144 and the data lines 150, 152, and 154 according to an exemplary embodiment of the present invention may be formed on the same layer or different layers and may be disposed independently from each other. When viewed from a top plan view, the first gate wiring 132 and the second gate wiring 134, the plurality of driving voltage lines 140, 142, and 144 and the data lines 150, 152, and 154 may be parallel with each other.

According to an exemplary embodiment of the present invention, the first gate wiring 132 and the second gate wiring 134 disposed in parallel toward a first direction and the driving voltage lines 140, 142, and 144 and the data lines 150, 152, and 154 disposed in parallel toward another direction intersecting the first direction may form a matrix.

The thin film transistor may be formed in a position overlapping with an intersecting area of the first gate wiring 132, the second gate wiring 134, the driving voltage lines 140, 142, and 144, and the data lines 150, 152, and 154. The thin film transistor may be formed in each pixel of the display apparatus according to exemplary embodiments of the present invention. The first gate wiring 132 and the second gate wiring 134 according to an exemplary embodiment of the present invention may be electrically connected to the gate electrode of the thin film transistor and the driving voltage lines 140, 142, and 144. The data lines 150, 152, and 154 may be electrically connected to the source electrode and the drain electrode of the thin film transistor.

One pixel may include a plurality of thin film transistors. Thus, the interval between the first gate wiring 132, the second gate wiring 134, the driving voltage lines 140, 142, 144, and the data lines 150, 152, and 154 according to an exemplary embodiment of the present invention may be relatively narrow.

When the interval between the wirings is relatively narrow, and the third gate insulating layer 126 is formed on the first gate wiring 132 and the second gate wiring 134, a valley may be formed on the third gate insulating layer 126 formed between the gate wirings 130 due to the thickness of the gate wiring 130.

To form the driving voltage lines 140, 142, and 144 or the data lines 150, 152, and 154, a conductive material might not be sufficiently removed from the surface of the third gate insulating layer 126 in a process of applying and etching the conductive material. When the conductive material remains in the valley formed between the first gate wiring 132 and the second gate wiring 134, a short circuit may occur between the driving voltage lines 140, 142, and 144 and the data lines 150, 152, and 154.

The occurrence of the short circuit between the driving voltage lines 140, 142, and 144 and the data lines 150, 152, and 154 may be reduced or prevented in a high resolution display apparatus in which the interval between the wirings is reduced. The display apparatus according to an exemplary embodiment of the present invention may include the short circuit protection area 160.

The short circuit protection area 160 according to an exemplary embodiment of the present invention may be an area formed on a portion of the third gate insulating layer 126 and may have a boundary formed by the first gate wiring 132, the second gate wiring 134, the driving voltage lines 140, 142, and 144, and the data lines 150, 152, and 154. The short circuit protection area 160 may be any of the areas having a matrix form formed by the first gate wiring 132, the second gate wiring 134, the driving voltage lines 140, 142, and 144, and the data lines 150, 152, and 154 which intersect with each other.

An interval d2 between the first gate wiring 132 and the second gate wiring 134 in the short circuit protection area 160 according to an exemplary embodiment of the present invention may be larger than an interval d1 between the first gate wiring 132 and the second gate wiring 134 outside of the short circuit protection area 160.

According to an exemplary embodiment of the present invention the short circuit protection area 160 may have the interval d2 between the first gate wiring 132 and the second gate wiring 134 in the short circuit protection area 160 which may be larger than the interval d1 between the first gate wiring 132 and the second gate wiring 134 outside of the short circuit protection area 160.

The interval between the first gate wiring 132 and the second gate wiring 134 outside of the short circuit protection area 160 may be the interval d1 between the wirings disposed parallel with each other when these wirings are projected on a plane. The interval d2 between the first gate wiring 132 and the second gate wiring 134 in the short circuit protection area 160 may be an average value or a maximum value of the interval measured by projecting these wirings on the plane.

As illustrated in FIG. 2, in an exemplary embodiment of the present invention, when the interval d2 between the first gate wiring 132 and the second gate wiring 134 in the short circuit protection area 160 is larger than the interval d1 between the first gate wiring 132 and the second gate wiring 134 outside of the short circuit protection area 160, the gate wirings 130 may gradually approach each other and the occurrence of the valley in the third gate insulating layer 126 may be reduced or prevented.

Thus, the occurrence of the short circuit between the driving voltage lines 140, 142, and 144 and the data lines 150, 152, and 154 formed on the third gate insulating layer 126 may be reduced or prevented.

As illustrated in FIG. 1, the display apparatus according to an exemplary embodiment of the present invention may include a capacitor 180. The capacitor 180 may include a lower electrode 182 and an upper electrode 184, which may face each other. According to an exemplary embodiment of the present invention, the lower electrode 182 may be formed on the second gate insulating layer 124 and the upper electrode 184 may be formed on the third gate insulating layer 126.

These lower electrode 182 and upper electrode 184 each may be formed on the same layer by the same process as the second gate wiring 134 and the driving voltage lines 140, 142, and 144, and the data lines 150, 152, and 154 which may be formed on the second gate insulating layer 124 and the third gate insulating layer 126.

According to an exemplary embodiment of the present invention, the third gate insulating layer 126 may be formed between the upper electrode 184 and the lower electrode 182. Thus, the third gate insulating layer 126 may serve as a dielectric layer.

After the capacitor 180 is formed, the interlayer insulating layer may be formed on the capacitor 180 and the display panel capable of displaying an image by controlling an electrical signal using the thin film transistor and the capacitor 180 may be formed thereon.

When the display apparatus according to an exemplary embodiment of the present invention is an organic light emitting display, a passivation layer may be formed on the interlayer insulating layer and a barrier rib opening may be formed in a pixel area. A pixel electrode may be formed in the opened pixel area. The display apparatus may include an organic emission layer, and a common electrode may be formed on the passivation layer.

However, the display apparatus according to an exemplary embodiment of the present invention is not limited to the organic light emitting device, and display apparatuses displaying an image by various methods may be used.

The display apparatus according to another exemplary embodiment of the present invention may include a stepped part 170 formed within the short circuit protection area 160.

Figure 3:
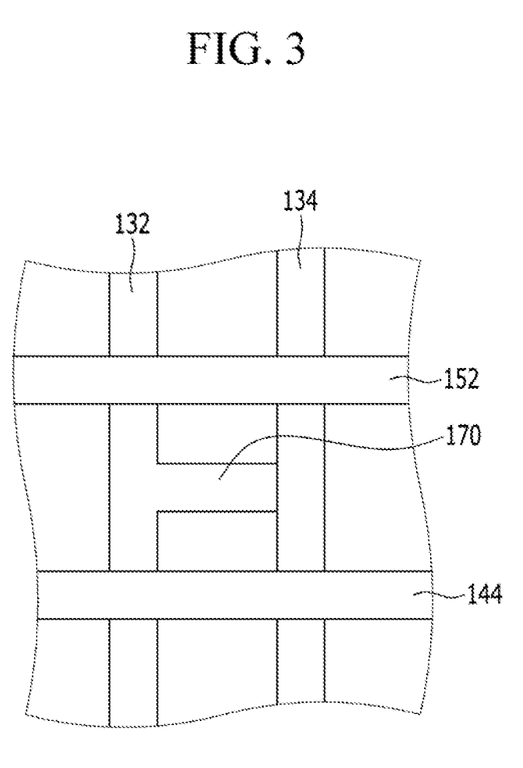
FIG. 3 is a plan view schematically illustrating a short circuit protection area according to another exemplary embodiment of the present invention.
Figure 4:
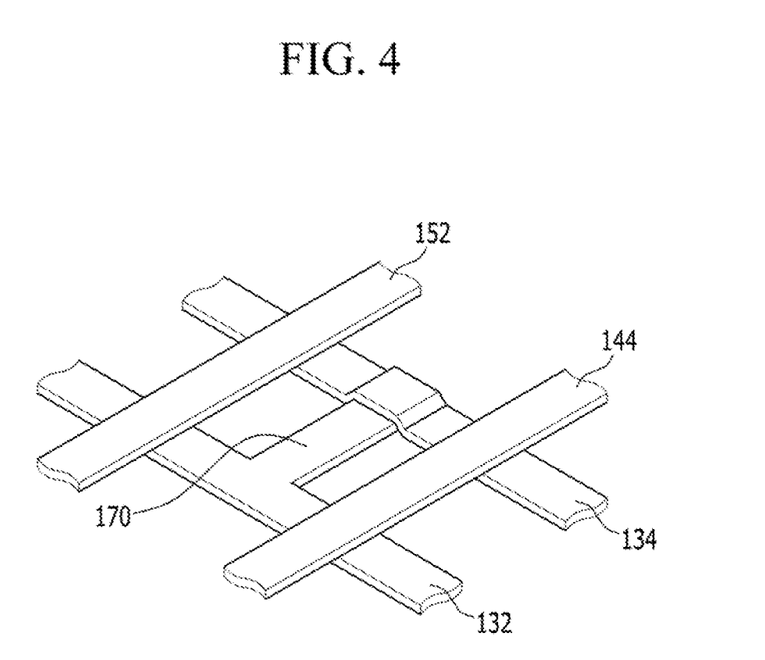
FIG. 4 is a perspective view of the short circuit protection area of FIG, 3.
Figure 5:
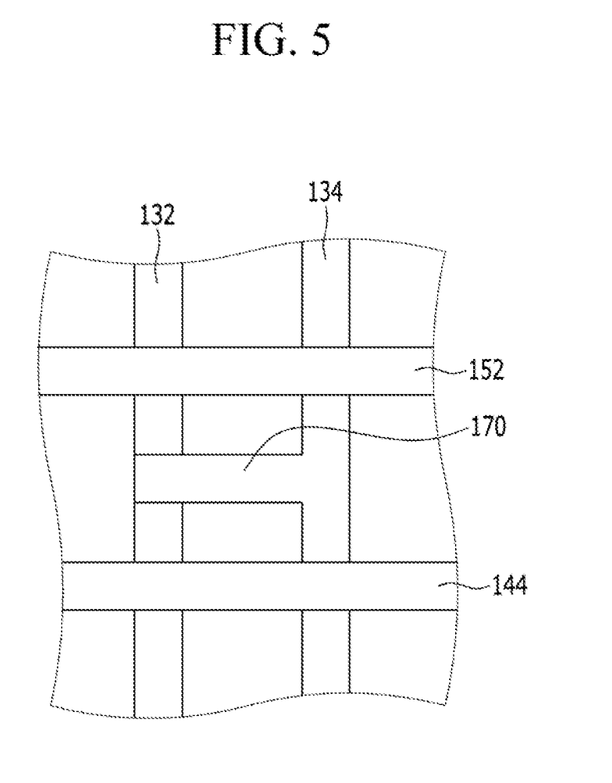
FIG. 5 is a diagram schematically illustrating a short circuit protection area according to another exemplary embodiment of the present invention.
Figure 6:
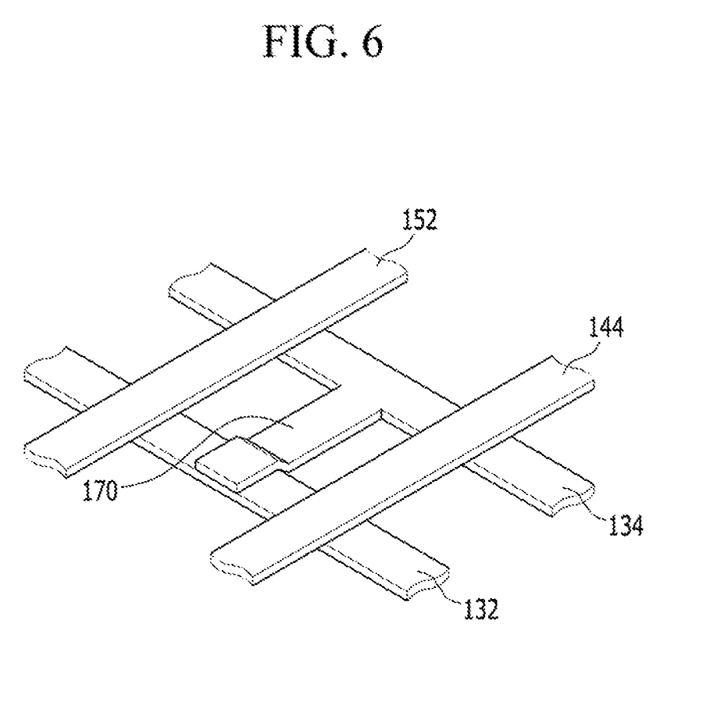
FIG. 6 is a perspective view of the short circuit protection area of FIG. 5.

FIG. 3 is a plan view schematically illustrating a short circuit protection area 160 according to another exemplary embodiment of the present invention. FIG. 4 is a perspective view of the short circuit protection area of FIG. 3. FIG. 5 is a diagram schematically illustrating a short circuit protection area according to another exemplary embodiment of the present invention. FIG. 6 is a perspective view of the short circuit protection area of FIG. 5. The gate insulating layer may be omitted according to exemplary embodiments of the present invention. The first gate wiring 132, the second gate wiring 134, the driving voltage lines 140, 142, and 144, and the data lines 150, 152, and 154 according to exemplary embodiments of the present invention are schematically illustrated in FIGS. 3-6.

The stepped part 170 may protrude from any one of the first gate wiring 132 and the second gate wiring 134 and a step may be formed on the third gate insulating layer 126 formed thereon.

The stepped part 170 according to an exemplary embodiment of the present invention may protrude from any one of the first gate wiring 132 and the second gate wiring 134. The stepped part 170 may include the same material as the first gate wiring 132 and the second gate wiring 134.

The stepped part 170 according to another exemplary embodiment of the present invention protruding from the first gate wiring 132 will be described in more detail below with reference to FIGS. 3 and 4.

The first gate wiring 132 may be formed below the second gate wiring 134, and thus, the stepped part 170 protruding from the first gate wiring 132 may be formed below the second gate wiring 134. Due to the thickness of the stepped part 170, the second gate insulating layer 124 and the second gate wiring 134 disposed on the stepped part 170 as illustrated in FIG. 4 may have a step over the stepped part 170. Thus, the third gate insulating layer 126 formed on the second gate wiring 134 may also have a step.

When the step is formed in the short circuit protection area 160 of the third gate insulating layer 126 by the stepped part 170 according to an exemplary embodiment of the present invention, an occurrence of a valley in the third gate insulating layer 126 may be reduced or prevented by the step, which may protrude upward. Thus, an occurrence of a short circuit between the driving voltage lines 140, 142, and 144 and the data lines 150, 152, and 154 formed on the third gate insulating layer 126 may be reduced or prevented.

The stepped part 170 according to another exemplary embodiment of the present invention protruding from the second gate wirings 134 will be described in more detail below with reference to FIGS. 5 and 6.

The second gate wiring 134 may be formed above the first gate wiring 132, and thus the stepped part 170 protruding from the second gate wiring 134 may be formed on the first gate wiring 132. Due to the thickness of the first gate wiring 132, the stepped part 170 formed on the first gate wiring 132, as illustrated in FIG. 6 for example, may have a step over the first gate wiring 132. Thus, the third gate insulating layer 126 formed on the stepped part 170 may also have a step.

When the step is formed in the short circuit protection area 160 of the third gate insulating layer 126 by the stepped part 170, an occurrence of a valley in the third gate insulating layer 126 may be reduced or prevented by the step formed to protrude upward. An occurrence of a short circuit between the driving voltage lines 140, 142, and 144 and the data lines 150, 152, and 154 formed on the third gate insulating layer 126 may be reduced or prevented.

The display apparatus according to an exemplary embodiment of the present invention will be described in more detail below. According to an exemplary embodiment of the present invention, the stepped part 170 which may increase the interval between the first gate wiring 132 and the second gate wiring 134 in the short circuit protection area 160 or which may form the step in the short circuit protection area 160 may be provided, and thus an occurrence of a short circuit due to the reduction in the interval between the gate wirings 130 may be reduced or prevented.

Exemplary embodiments of the present invention are not limited to the above-mentioned exemplary embodiments.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display apparatus, comprising:
   a substrate;
   a semiconductor layer on the substrate, wherein the semiconductor layer includes a first semiconductor layer and a second semiconductor layer spaced apart from the first semiconductor layer;
   a first gate insulating layer on the semiconductor layer;
   a first gate wiring on the first gate insulating layer, wherein the first gate wiring overlaps the first semiconductor layer;
   a second gate insulating layer on the first gate wiring;
   a second gate wiring on the second gate insulating layer, wherein the second gate wiring overlaps the second semiconductor layer;
   a third gate insulating layer covering the second gate wiring;
   a driving voltage line on the third gate insulating layer, wherein the driving, voltage line intersects the first gate wiring and the second gate wiring;
   a data line on the third gate insulating layer, wherein the data line intersects the first gate wiring and the second gate wiring; and
   a stepped part protruding from any one of the first gate wiring and the second gate wiring to form a step in a cross section view of the display apparatus.

2. The display apparatus of claim 1, wherein the stepped part includes a same material as at least one of the first gate wiring and the second gate wiring.

3. The display apparatus of claim 1, further comprising:
   a lower electrode of a capacitor on the second gate insulating layer; and
   an upper electrode of the capacitor on the third gate insulating layer.

4. The display apparatus of claim 1, further comprising:
   a buffer layer between the substrate and the semiconductor layer.

5. The display apparatus of claim 1, wherein the stepped part is between a data line and a driving voltage line.

6. The display apparatus of claim 1, further comprising:
   a short circuit protection area between the first gate wiring and the second gate wiring,
   wherein the short circuit protection area is between the driving voltage line and the data line; and
   wherein the stepped part is in the short circuit protection area.

7. The display apparatus of claim 6, wherein the short circuit protection area is an area having a matrix form formed by the first gate wiring, the second gate wiring, the driving voltage line and the data line which are disposed to intersect each other.

8. The display apparatus of claim 6, wherein a part of the stepped part overlaps a part of another one of the first gate wiring and the second gate wiring in the short circuit protection area.

9. A display apparatus, comprising:
   a substrate;
   a semiconductor layer on the substrate, wherein the semiconductor layer includes a first semiconductor layer and a second semiconductor layer spaced apart from the first semiconductor layer;
   first gate insulating layer on the semiconductor layer;
   a first gate wiring on the first gate insulating layer, wherein the first gate wiring overlaps the first semiconductor layer;
   a second gate insulating layer on the first gate wiring;
   a second gate wiring on the second gate insulating layer, wherein the second gate wiring overlaps the second semiconductor layer;
   a third gate insulating layer covering the second gate wiring;
   a driving voltage line on the third gate insulating layer, wherein the driving voltage line intersects the first gate wiring and the second gate wiring;
   a data line on the third gate insulating layer, wherein the data line intersects the first gate wiring and the second gate wiring; and
   A stepped part protruding from any one of the first gate wiring and the second gate wiring,
   wherein the stepped part protrudes from the first gate wiring toward the second gate wiring to be disposed under the second gate wiring, and wherein the stepped part forms a step on the second gate wiring and the third gate insulating layer.

10. The display apparatus of claim 9, further comprising:
    a short circuit protection area between the first gate wiring and the second gate wiring,
    wherein the. short circuit protection area is between the driving voltage line and the data line; and
    wherein the stepped part is in the short circuit protection area.

11. The display apparatus of claim 10, wherein a part of the stepped part overlaps a part of the second gate wiring in the short circuit protection area.

12. A display apparatus, comprising:
    a substrate;
    a semiconductor layer on the substrate, wherein the semiconductor layer includes a first semiconductor layer and a second semiconductor layer spaced apart from the first semiconductor layer;
    a first gate insulating layer on the semiconductor layer;
    a first gate wiring on the first gate insulating layer, wherein the first wiring overlays the first semiconductor layer;
    a second gate insulating layer on the first gate wiring
    a second gate wiring on the second gate insulating layer, wherein the second gate wiring overlaps the second semiconductor layer;
    a third gate insulating layer covering the second gate wiring;
    a driving voltage line on the third gate insulating layer, wherein the driving voltage line interests the first gate wiring and the second gate wiring;

a data line on the third gate layer, wherein the, data line intersects the, first gate wiring and the second gate wiring; and, a stepped part protruding any one of the first gate wiring and the second gate wiring, wherein the stepped part protrudes from the second gate wiring toward the first gate wiring to be disposed on the first gate wiring, and wherein the stepped part forms a step on the second gate wiring and the third gate insulating layer.

13. The display apparatus of claim 12, further comprising:

a short circuit protection area between the first gate wiring and the second gate wiring, wherein the short circuit protection area is between the driving voltage line and the data line; and wherein the stepped part is in the short circuit protection area.

14. The display apparatus of claim 13, wherein a part of the stepped part overlaps a part of the first gate wiring in the short circuit protection area.

* * * * *